(12) United States Patent
Lin et al.

(10) Patent No.: US 9,847,295 B2
(45) Date of Patent: Dec. 19, 2017

(54) ENHANCING BARRIER IN AIR GAP TECHNOLOGY

(71) Applicant: International Business Machines Corporation, Armonk, NY (US)

(72) Inventors: Wei Lin, Albany, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/831,897

(22) Filed: Aug. 21, 2015

(65) Prior Publication Data
US 2015/0371954 A1 Dec. 24, 2015

Related U.S. Application Data

(62) Division of application No. 14/277,163, filed on May 14, 2014, now Pat. No. 9,263,389.

(51) Int. Cl.
*H01L 21/76* (2006.01)
*H01L 21/4763* (2006.01)
(Continued)

(52) U.S. Cl.
CPC .... *H01L 23/53209* (2013.01); *H01L 21/7682* (2013.01); *H01L 21/76802* (2013.01); *H01L 21/76829* (2013.01); *H01L 21/76834* (2013.01); *H01L 21/76846* (2013.01); *H01L 21/76867* (2013.01); *H01L 23/528* (2013.01); *H01L 23/5222* (2013.01); *H01L 23/5329* (2013.01); *H01L 23/53223* (2013.01); *H01L 23/53238* (2013.01); *H01L 23/53266* (2013.01); *H01L 23/53295* (2013.01); *H01L 2924/0002* (2013.01)

(58) Field of Classification Search
CPC .......... H01L 21/7682; H01L 21/53209; H01L 21/76802; H01L 21/76841; H01L 21/76846; H01L 21/76868
USPC .................. 257/751, 758, E21.581, E21.573, 257/E21.584; 438/619, 421, 411
See application file for complete search history.

(56) References Cited

U.S. PATENT DOCUMENTS 7,304,384 B2   12/2007  Koike et al.
7,605,082 B1*  10/2009  Reid .................. C23C 18/1607
                                                 257/E21.076
(Continued)

FOREIGN PATENT DOCUMENTS

WO    WO 2013101096 A1 *  7/2013  ......... H01L 21/7685

OTHER PUBLICATIONS

IBM: List of IBM Patents or Patent Applications Treated As Related (Appendix P), Sep. 11, 2015, 2 pages.
(Continued)

*Primary Examiner* — Fernando L Toledo
*Assistant Examiner* — Aaron Gray
(74) *Attorney, Agent, or Firm* — L. Jeffrey Kelly

(57) ABSTRACT

A semiconductor structure including a first metal line and a second metal line in a dielectric layer, the first metal line and the second metal line are adjacent and within the same dielectric level; an air gap structure in the dielectric layer and between the first metal line and the second metal line, wherein the air gap structure includes an air gap oxide layer and an air gap; and a barrier layer between the air gap structure and the first metal line, wherein the barrier layer is an oxidized metal layer.

6 Claims, 10 Drawing Sheets

(51) Int. Cl.
*H01L 23/48* (2006.01)
*H01L 23/52* (2006.01)
*H01L 29/40* (2006.01)
*H01L 23/532* (2006.01)
*H01L 21/768* (2006.01)
*H01L 23/522* (2006.01)
*H01L 23/528* (2006.01)

(56) References Cited

U.S. PATENT DOCUMENTS

| | | | |
|---|---|---|---|
| 7,884,475 B2 | 2/2011 | Gambino et al. | |
| 7,935,631 B2 | 5/2011 | Sparks | |
| 8,039,966 B2 | 10/2011 | Yang et al. | |
| 8,344,508 B2 | 1/2013 | Hinomura | |
| 8,609,531 B1* | 12/2013 | Zhang | H01L 23/53238 257/E21.582 |
| 2008/0311742 A1 | 12/2008 | Watanabe et al. | |
| 2009/0140428 A1 | 6/2009 | Bonilla et al. | |
| 2009/0298282 A1 | 12/2009 | Yun et al. | |
| 2009/0302475 A1 | 12/2009 | Korogi et al. | |
| 2010/0035428 A1* | 2/2010 | Nakao | H01L 21/2855 438/653 |
| 2011/0309517 A1 | 12/2011 | Miki et al. | |
| 2012/0319279 A1 | 12/2012 | Isobayashi | |
| 2013/0277842 A1 | 10/2013 | Baumann et al. | |
| 2013/0292835 A1* | 11/2013 | King | H01L 21/02178 257/741 |
| 2015/0303140 A1* | 10/2015 | Lin | H01L 21/764 257/750 |
| 2015/0332999 A1* | 11/2015 | Ting | H01L 23/53295 257/773 |

OTHER PUBLICATIONS

Pending U.S. Appl. No. 14/277,163, filed May 14, 2014, entitled: "Enhancing Barrier in Air Gap Technology", 27 pages.

Au et al., "Selective Chemical Vapor Deposition of Manganese Self-Aligned Capping Layer for Cu Interconnections in Microelectronics", Journal of The Electrochemical Society, 157 (6) D341-D345 (2010), Manuscript submitted Nov. 19, 2009; revised manuscript received Feb. 15, 2010. Published Apr. 26, 2010.

Ohoka et al., "Integration of Self-Formed Barrier Technology for 32nm-node Cu Dual-Damascene Interconnects with Hybrid Low-k (PAr/SiOC) Structure", 2006 IEEE, 2006 Symposium on VLSI technology Digest of Technical Papers.

Pending U.S. Appl. No. 14/277,163, filed May 14, 2014, entitled: "Enhancing Barrier in Air Gap Technology", pp. 1-27.

* cited by examiner

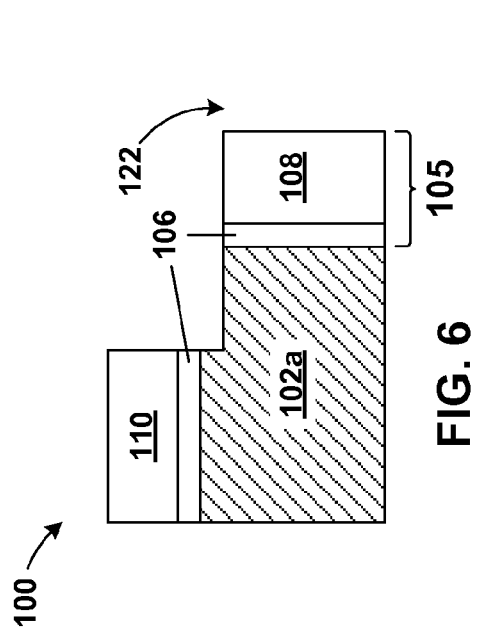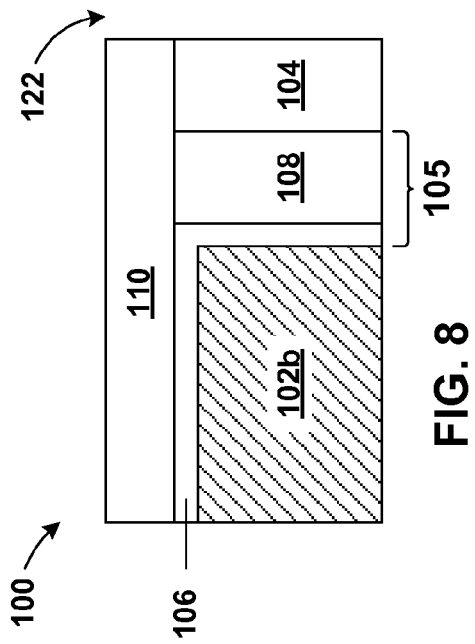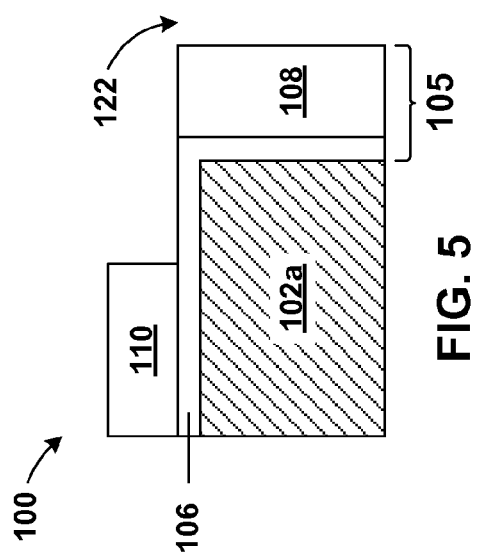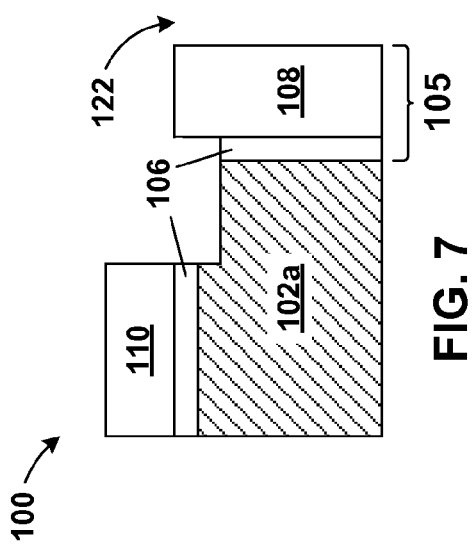

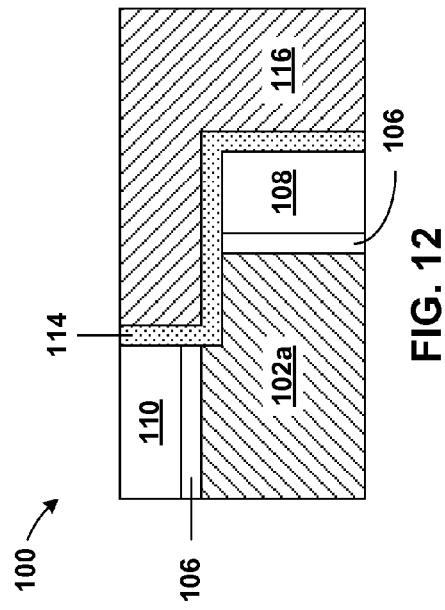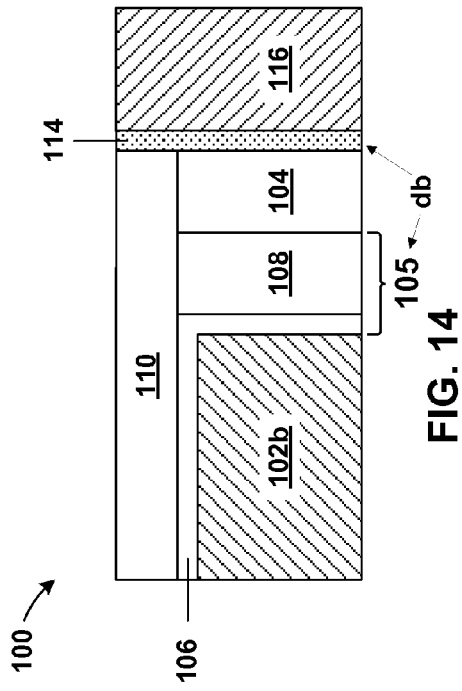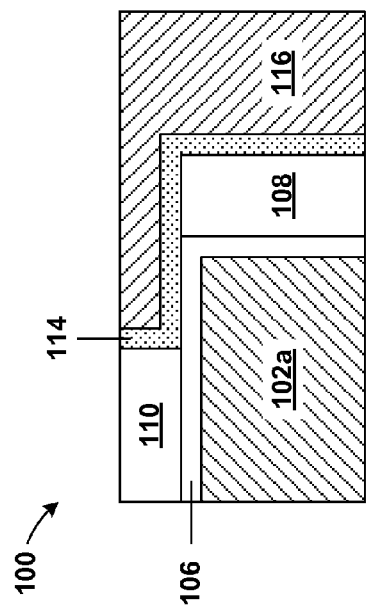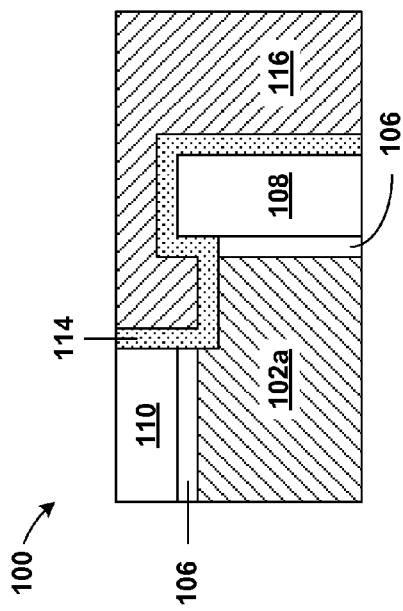

though that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

ENHANCING BARRIER IN AIR GAP TECHNOLOGY

BACKGROUND

The present invention generally relates to semiconductor device manufacturing, and more particularly to fabricating an air gap with a barrier layer.

A semiconductor chip consists of an array of devices whose contacts are interconnected by patterns of metal wiring. In very large scale integration (VLSI) chips, these metal patterns are multilayered and are separated by layers of an insulating material. Typical integrated circuit chip designs utilize one or more wiring levels. Insulating or dielectric materials are employed between the wires in each level (intra-level dielectric) and between the wiring levels (inter-level dielectric). The desire for smaller chips may result in higher device density and tighter space between wires and wire levels.

SUMMARY

According to one embodiment of the present invention, a structure with a preformed barrier layer is provided. The structure may include a first metal line and a second metal line in a dielectric layer, the first metal line and the second metal line are adjacent and within the same dielectric level; an air gap structure in the dielectric layer and between the first metal line and the second metal line, wherein the air gap structure includes an air gap oxide layer and an air gap; and a barrier layer between the air gap structure and the first metal line, wherein the barrier layer is an oxidized metal layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 5 is a section view of the structure illustrated in FIG. 4 taken along section view B and illustrates the formation of the opening above a portion of a metal line according to an exemplary embodiment.

FIG. 6 is a section view of the structure illustrated in FIG. 4 taken along section view B and illustrates the formation of the opening above a portion of the metal line according to another embodiment.

FIG. 7 is a section view of the structure illustrated in FIG. 4 taken along section view B and illustrates the formation of the opening above a portion of the metal line according to another embodiment.

FIG. 8 is a section view of the structure illustrated in FIG. 4 taken along section view C and illustrates the formation of the opening adjacent to the metal line according to another embodiment.

FIG. 11 is a section view of the structure illustrated in FIG. 10 taken along section view D and illustrates the formation of the barrier layer between the metal line and the air gap oxide according to an exemplary embodiment.

FIG. 12 is a section view of the structure illustrated in FIG. 10 taken along section view D and illustrates the formation of the barrier layer between the metal line and the air gap oxide according to another embodiment.

FIG. 13 is a section view of the structure illustrated in FIG. 10 taken along section view D and illustrates the formation of the barrier layer between the metal line and the air gap oxide according to another embodiment.

FIG. 14 is a section view of the structure illustrated in FIG. 10 taken along section view E and illustrates the formation of the barrier layer and a dielectric layer between the metal line and the air gap oxide according to another embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
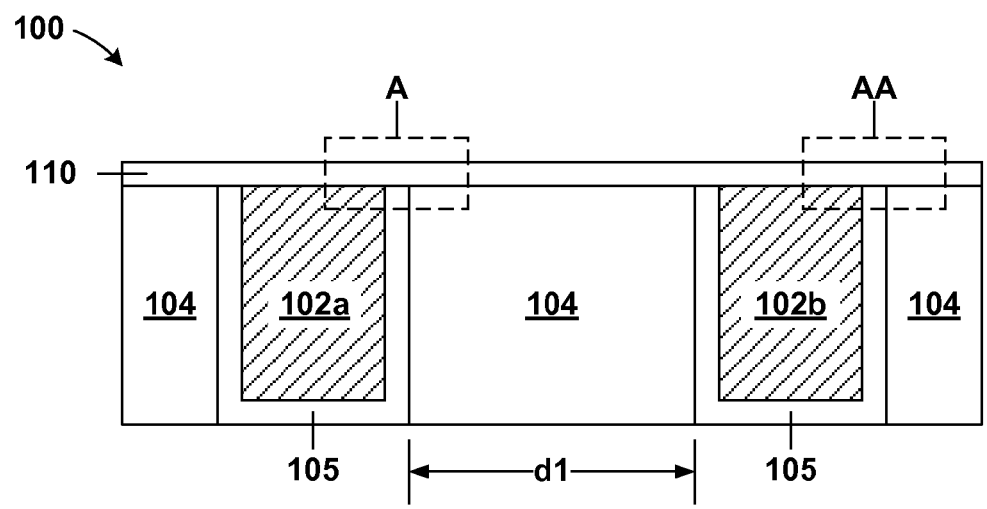
FIG. 1 is a cross section view of a semiconductor structure according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to fabricating an air gap with a barrier layer. Ideally, it may be desirable to fabricate an air gap in the back-end-of-line (BEOL) region of a semiconductor structure without exposing or contacting a metal line to an air gap oxide layer to avoid diffusion or electrical connection. One way to fabricate an air gap without exposing or contacting the metal line is to form a barrier layer between the air gap oxide layer and the metal line. One embodiment by which to form the barrier layer between the air gap oxide layer and the metal line is described in detail below by referring to the accompanying drawings FIGS. 1-14.

Figure 2:
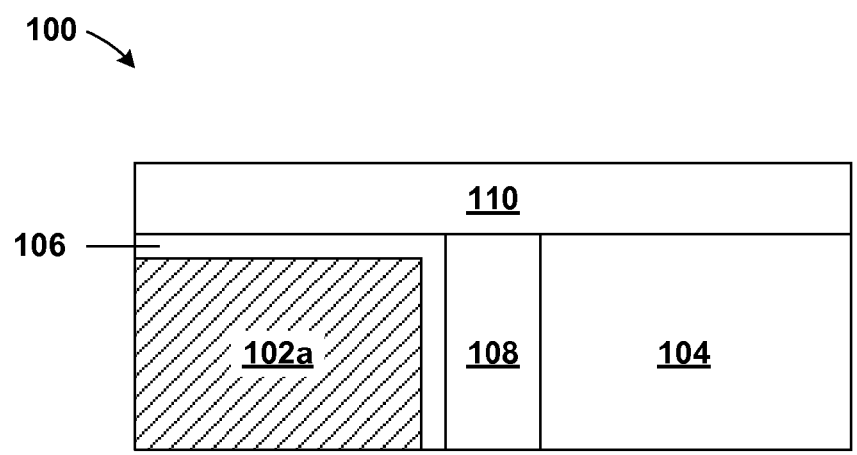
FIG. 2 is a section view of the structure illustrated in FIG. 1 taken along section view A.

FIGS. 1 and 2 are demonstrative illustrations of a structure 100 during an intermediate step of a method of fabricating an air gap according to an embodiment. More specifically, the method can start with fabricating a cap 110 above a first metal line 102a and a second metal line 102b, where the first and second metal lines 102a, 102b are in an intra-level dielectric layer 104 (hereinafter "ILD"). FIG. 2 depicts a section view of the structure 100 illustrated in FIG. 1 taken along section A. The structure 100 illustrated in section view A may be similar to the structure 100 illustrated in section view AA.

The structure 100 may be formed by depositing the ILD 104 on a lower-level BEOL, a middle-end-of-line, or a substrate by any method known in the art, such as, for example, chemical vapor deposition, plasma enhanced chemical vapor deposition, atomic layer deposition, or physical vapor deposition. The ILD 104 may include any materials known in the art, such as, for example, oxides, nitrides, and oxynitrides. The ILD 104 may have a thickness ranging from about 25 nm to about 200 nm. The ILD 104 may be planarized using, for example, a chemical-mechanical polishing technique. Metal openings may be formed in the ILD 104 using any technique known in the art, such as, for example, wet or dry etching. The metal openings may be formed in preparation for forming the first and second metal line 102a, 102b.

The first and second metal lines 102a, 102b may be formed in the metal openings. The first metal line 102a may be substantially similar to the second metal line 102b. The first and second metal lines 102a, 102b may be conductive materials including, for example, copper (Cu), aluminum (Al), or tungsten (W). The first and second metal lines 102a, 102b may be fabricated using any technique known in the art, such as, for example, a single or dual damascene technique. There may be a first distance (d1) between the first and second metal lines 102a, 102b ranging from about 5 nm to about 200 nm. In an embodiment, the first and second metal lines 102a, 102b may be copper (Cu) and may include a metal barrier 105. The metal barrier 105 may include a first liner 106 and a second liner 108. The first liner 106 and the second liner 108 may be formed by any method known in the art. The first liner 106 may be any material known in the art including, for example, cobalt (Co) or ruthenium (Ru). The second liner 108 may be any material known in the art including, for example, tantalum (Ta), tantalum nitride (TaN), or any alloy therein. In an embodiment, the metal barrier 105 may be partially formed around the first and second metal line 102a, 102b having the first liner 106 cover all sides of the first and second metal lines 102a, 102b and the second liner 108 cover a sidewall and a bottom of the first and second metal lines 102a, 102b.

With continued reference to FIG. 1, the cap 110 may be deposited on the structure 100. The cap 110 may be an electrical insulator and may be used to improve interconnect reliability. The cap 110 may be deposited using typical deposition techniques, such as, for example, chemical vapor deposition. The cap 110 may include any suitable dielectric material, such as, for example, silicon nitride ($Si_3N_4$), silicon carbide (SiC), silicon carbon nitride (SiCN), hydrogenated silicon carbide (SiCH), or any other material known in the art. The cap 110 may have a thickness ranging from about 10 nm to about 55 nm and ranges there between, although a thickness less than 10 nm and greater than 55 nm may be acceptable.

Figure 3:
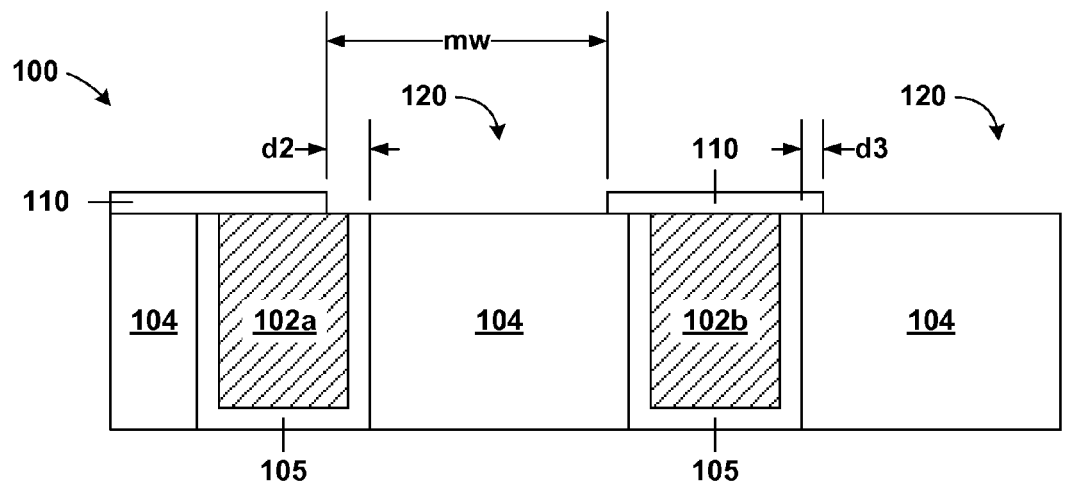
FIG. 3 is a cross section view of the semiconductor structure and illustrates the formation of a mask pattern on a top surface according to an exemplary embodiment.

FIG. 3 is a demonstrative illustration of the structure 100 during an intermediate step of a method of fabricating an air gap according to an embodiment. More specifically, the method may include patterning the cap 110 and forming a mask opening 120. The mask opening may have a mask width (mw).

An edge of the mask opening 120 may be aligned to an edge of the metal barrier 105. However, the edge of the mask opening 120 may be aligned, not aligned, or misaligned, from the edge of the metal barrier 105. In such case, the mask opening 120 may be misaligned by a second or third distance (d2, d3) from an edge of the metal barrier 105. The misalignment may be intentional or unintentional (possibly generated by lithography error). In an embodiment, an edge of the mask opening 120 may be a distance equal to the second distance (d2) from the edge of the metal barrier 105 and may overlap the first metal line 102a. Such cases are undesirable and may give rise to an electrical short, or other complications, during subsequent processing. Therefore, subsequent measures may be taken to protect the first metal line 102a from diffusion or electrical conduction. In another embodiment, after patterning, the cap 110 may cover the second metal line 102b and overlap the ILD 104 by a distance equal to the third distance (d3).

Figure 4:
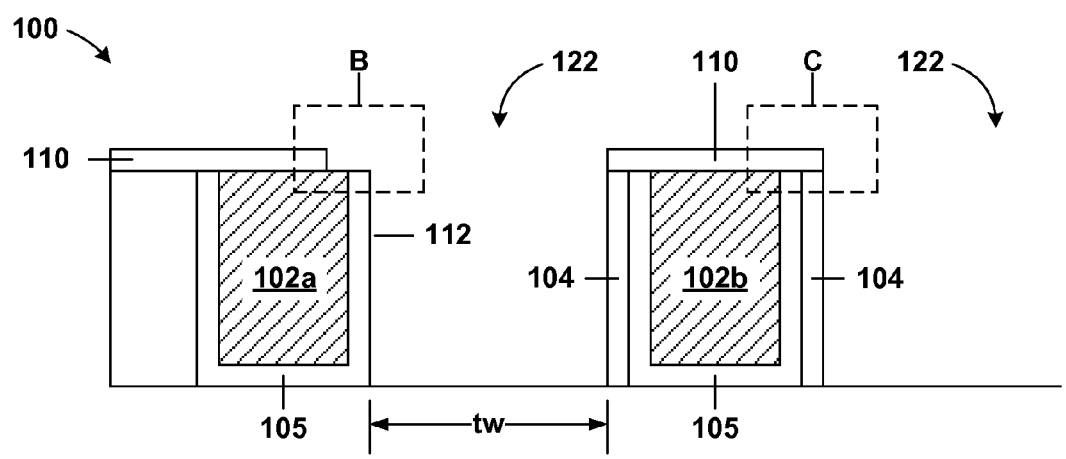
FIG. 4 is a cross section view of the semiconductor structure and illustrates the formation of a trench in the structure according to an exemplary embodiment.

FIG. 4 is a demonstrative illustration of the structure 100 during an intermediate step of a method of fabricating an air gap according to an embodiment. More specifically, the method may include removing a portion of the ILD 104 to form a trench 122.

The portion of the ILD 104 may be removed using the cap 110 as a mask. The etching technique may include any technique known in the art, such as, for example, a wet or dry etching technique. In an embodiment, the misalignment of the mask opening 120 (illustrated in FIG. 3) may result in a trench width (tw) that may be less than the mask width (mw), and may result in a portion of the ILD 104 remaining on a trench sidewall.

FIGS. 5, 6, and 7 represent alternative embodiments of the structure 100 in situations where the mask opening 120 (illustrated in FIG. 3) is above the first metal line 102a. More specifically, each embodiment may represent a different resulting structure formed during the etching of the trench 122. FIGS. 5, 6, and 7 each depict a section view of the structure 100 illustrated in FIG. 4 taken along section B according to alternative embodiments.

The mask opening 120 (illustrated in FIG. 3) may be above the first metal line 102a and may be misaligned, as described above. In an embodiment, as illustrated in FIG. 5, the first liner 106 may remain intact and may have some material removed during the etching process but may not expose the first metal line 102a. In another embodiment, as illustrated in FIG. 6, the first liner 106 and the second liner 108 may be etched at a similar rate. The first liner may be severed, exposing and possibly etching a portion of the first metal line 102a. In another embodiment, as illustrated in FIG. 7, the first liner 106 and the second liner 108 may be etched at different rates. The first liner may be severed, exposing and possibly etching a portion of the first metal line 102a.

FIG. 8 represents an alternative embodiment of the structure 100 in a situation where the mask opening 120 (illustrated in FIG. 3) overlaps a portion of the ILD 104. More specifically, the overlap of the mask opening 120 may leave a portion of the ILD 104 along a sidewall of the metal barrier 105. A possible benefit to this alternative embodiment is that it may allow for more layers between the trench 122 and the second metal line 102b, which may result in additional insulation or may prevent possible diffusion with any subsequently deposited material. FIG. 8 depicts a section view of the structure 100 illustrated in FIG. 4 taken along section C according to an alternative embodiment.

Figure 9:
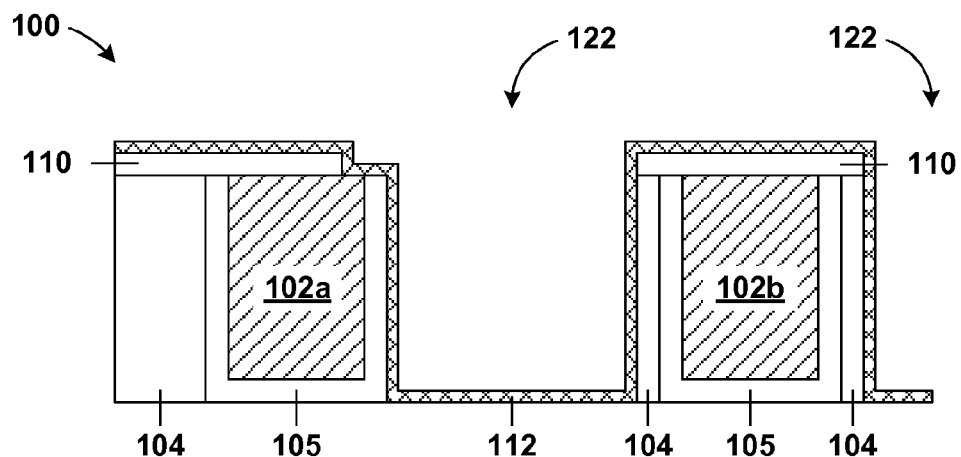
FIG. 9 is a cross section view of the semiconductor structure and illustrates the formation of an active component on the structure according to an exemplary embodiment.

FIG. 9 is a demonstrative illustration of the structure 100 during an intermediate step of a method of fabricating an air gap according to an embodiment. More specifically, the method may include the deposition of an active component 112 on the structure 100.

The active component 112 may be deposited on the structure 100 according to any techniques known in the art. The active component 112 may be deposited on all surfaces including, for example, an upper surface of the cap 110, a sidewall of the trench 122, and a bottom of the trench 122. The active component 112 may be any material known in the art, such as, for example, manganese (Mn), aluminum (Al), and titanium (Ti).

Figure 10:
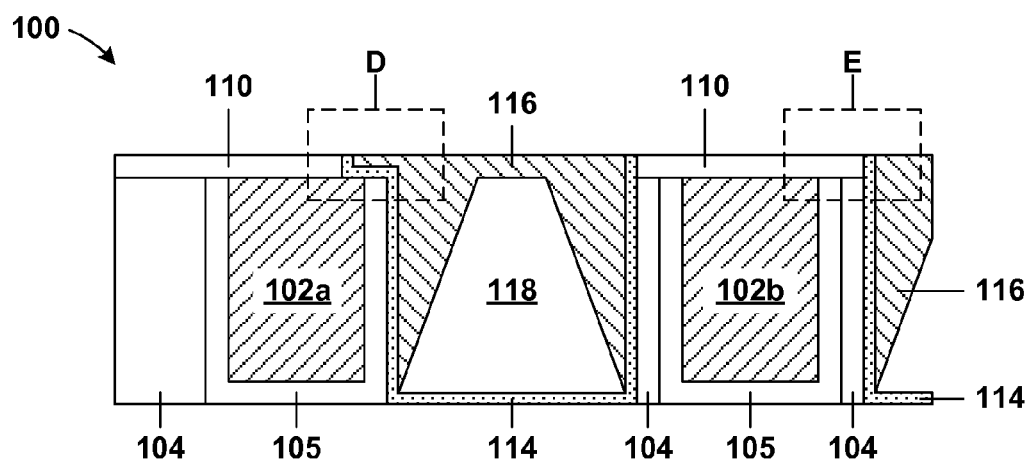
FIG. 10 is a cross section view of the semiconductor structure and illustrates the formation of an air gap, air gap oxide, and a barrier layer according to an exemplary embodiment.

FIG. 10 is a demonstrative illustration of the structure 100 during an intermediate step of a method of fabricating an air gap according to an embodiment. More specifically, the method may include the formation of an air gap oxide 116, an air gap 118, and a barrier layer 114.

The air gap oxide 116 may be a dielectric material, such as, for example, any oxide, nitride, or oxynitride; low-k dielectric is desired. The air gap 118 and air gap oxide 116 may be formed in the trench 122 (illustrated in FIG. 9) by any method known in the art, including, for example, depositing a porous dielectric layer over a disposable solid layer, where the disposable solid layer may then be removed through the porous dielectric layer forming a cavity in the porous dielectric layer. The active component 112 (illustrated in FIG. 9) may react with the air gap oxide 116 to form the barrier layer 114.

The present embodiment is different from the common method of self-forming barrier layers because the active component 112 is deposited after the trench 122 is formed and before the air gap 118 is formed, instead of self-forming. This method allows the barrier layer 114 to be formed, for example, in-situ or during a subsequent annealing step. In conventional self-forming barrier formation, the barrier relies on a pre-introduced active element in a metal alloy, which later diffuses out of the alloy towards an interface to form a barrier. The conventional method may not allow for sufficient amounts of the active component to be used for a barrier during a subsequent air gap formation. The present embodiment may include a thorough coverage of surfaces of the structure 100 prior to air gap 118 formation. The reliability of thorough coverage may be accomplished by depositing the active component 112 after the forming the trench 122 (illustrated in FIG. 9) to possibly assure that there is a consistent layer of the active component 112. In an embodiment, the barrier layer 114 may include, for example, $Mn_xSi_yC_zN_vO_w$. In a preferred embodiment, the barrier layer 114 may include $SiO_2$ and may be $MnSiO_3$.

FIGS. 11, 12, and 13 each represent an alternative embodiment of the structure 100 during the deposition of the air gap oxide 116. More specifically, each embodiment may represent the resulting barrier layer 114 from the previous embodiments illustrated in FIGS. 5, 6, and 7, respectively. FIGS. 11, 12, and 13 each depict a section view of the structure 100 illustrated in FIG. 10 taken along section D.

In an embodiment, as illustrated in FIG. 11, the barrier layer 114 may contact the cap 110, the first liner 106, and the second liner 108, but may not contact the first metal line 102a. The barrier layer 114 may provide additional insulation or act as a diffusion barrier for the first metal line 102a. In another embodiment, as illustrates in FIG. 12, the barrier layer 114 may contact the cap 110, the first liner 106, the second liner 108, and the first metal line 102a. In an embodiment, as illustrated in FIG. 13, the first liner 106 may be etched at a different rate than the second liner 108 where the barrier layer 114 may conform around a top and sidewalls of the second liner 108.

FIG. 14 represents an alternative embodiment of the structure 100 where the second metal 102b may be completely covered by the cap 110 after patterning. More specifically, the embodiment may result in the barrier layer 114 along the portion of the ILD 104 which may be between the metal barrier 105 and the barrier layer 114. FIG. 14 depicts a section view of the structure 100 illustrated in FIG. 10 taken along section E. In an embodiment, the barrier layer 114 may act as a double barrier (db) with the metal barrier 105.

Another way to fabricate an air gap without exposing or contacting a metal line may include using a preformed barrier layer prior to forming the barrier layer between the oxide layer and the metal line. One embodiment by which to include the preformed barrier layer is described in detail below by referring to the accompanying drawings FIGS. 14-20.

Figure 15:
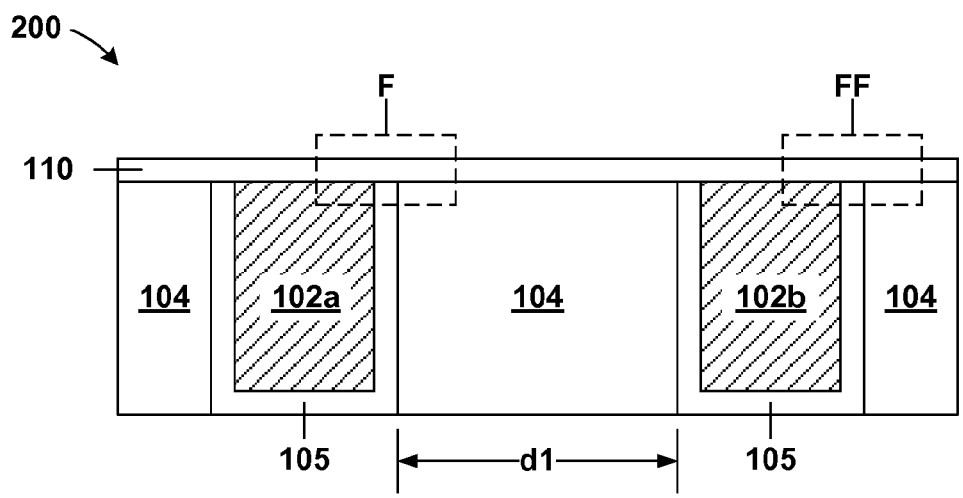
FIG. 15 is a cross section view of a semiconductor structure according to another embodiment.
Figure 16:
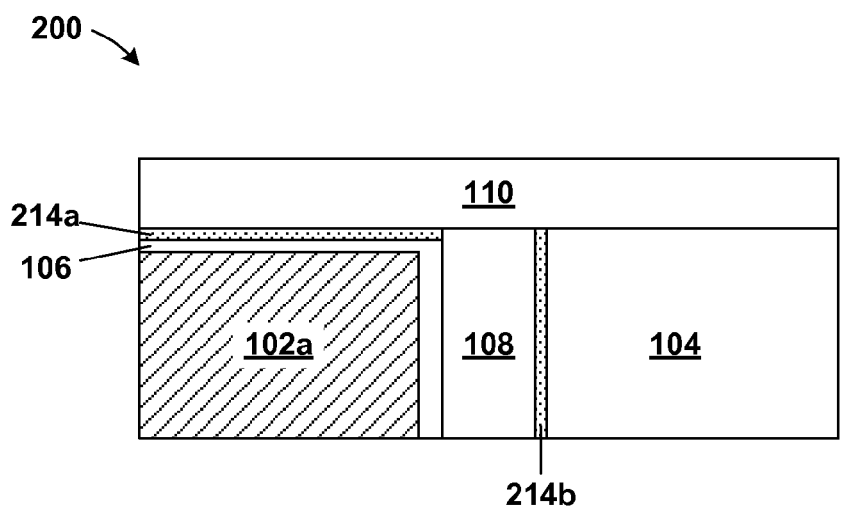
FIG. 16 is a section view of the structure illustrated in FIG. 15 taken along section view F.

FIGS. 15 and 16 are demonstrative illustrations of a structure 200 during an intermediate step of a method of fabricating an air gap according to an embodiment. More specifically, the method may include fabricating the cap 110 above the first metal line 102a and the second metal line 102b with a first preformed barrier layer 214a and a second preformed barrier layer 214b. FIG. 16 depicts a section view of the structure 200 illustrated in FIG. 15 taken along section F. The structure 200 illustrated in section view F may be similar to the structure 200 illustrated in section view FF.

The first preformed barrier layer 214a may be formed on the top of the first and second metal lines 102a, 102b and may be formed before the deposition of the cap 110. The second preformed barrier layer 214b may be formed on the side of the metal barrier 105, separating the metal barrier 105 from the ILD 104. The first and second preformed barrier layers 214a, 214b may be a similar material, and formed using a similar method, as the barrier layer 114 described above.

Figure 17:
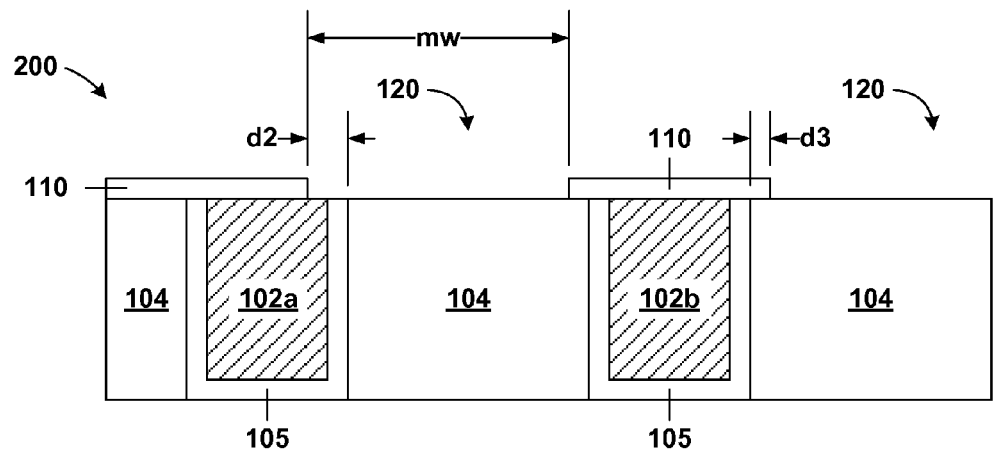
FIG. 17 is a cross section view of the semiconductor structure and illustrates the formation of a mask pattern on a top surface according to another embodiment.

FIG. 17 is a demonstrative illustration of the structure 200 during an intermediate step of a method of fabricating an air gap according to an embodiment. More specifically, the method may include patterning the cap 110 and forming a mask opening 120. The mask opening may have a mask width (mw). The structure 200 illustrated in FIG. 17 may be similar to the structure 100 described in FIG. 3.

Figure 18:
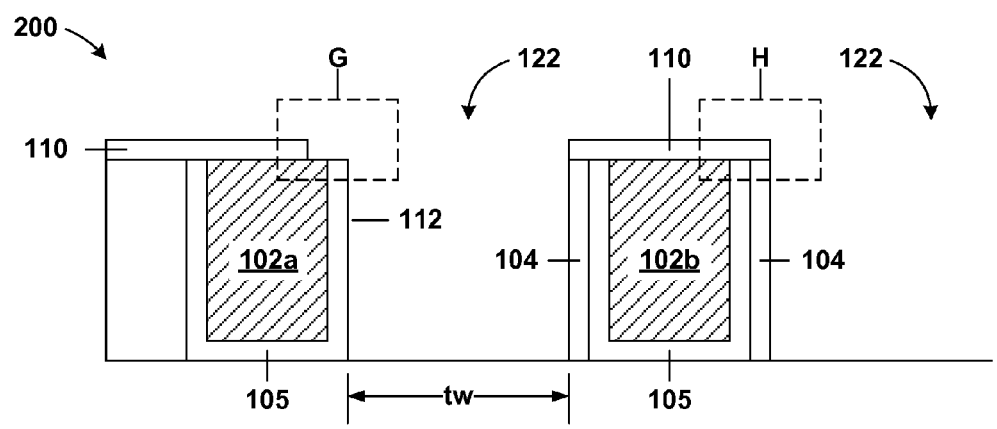
FIG. 18 is a cross section view of the semiconductor structure and illustrates the formation of a trench in the structure according to another embodiment.

FIG. 18 is a demonstrative illustration of the structure 200 during an intermediate step of a method of fabricating an air gap according to an embodiment. More specifically, the method may include removing a portion of the ILD 104 to form a trench 122. The structure 200 illustrated in FIG. 18 may be similar to the structure 100 described in FIG. 4.

Figure 19:
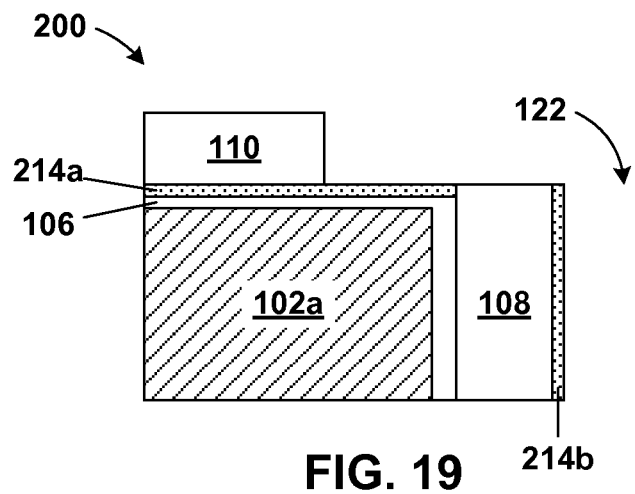
FIG. 19 is a section view of the structure illustrated in FIG. 18 taken along section view G and illustrates the formation of a trench and a preformed barrier layer according to another embodiment.

FIG. 19 represents an embodiment of the structure 200 in a situation where the mask opening 120 (illustrated in FIG. 17) is above the first metal line 102a and above the first and second preformed barrier layers 214a, 214b. More specifically, a portion of the first and second preformed barrier layers 214a, 214b may be exposed and may act as an etch stop during the formation of the trench 122. FIG. 19 depicts a section view of the structure 200 illustrated in FIG. 18 taken along section G according to an embodiment.

The mask opening 120 (illustrated in FIG. 17) may be above the first metal 102a and may be misaligned, as described above. In an embodiment, the first preformed barrier layer 214a and the second liner 108 may not be etch or may be slightly etched possibly leaving the first metal line 102a insulated from the trench 122.

Figure 20:
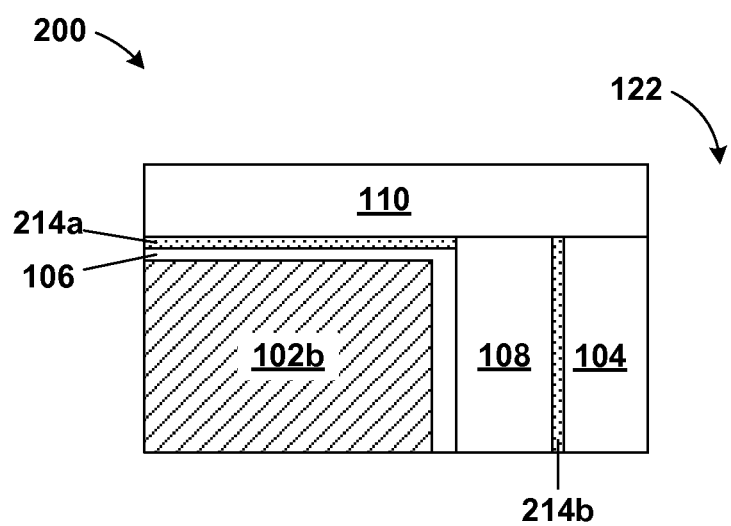
FIG. 20 is a section view of the structure illustrated in FIG. 18 taken along section view H and illustrates the formation of the trench and the preformed barrier layer according to another embodiment.

FIG. 20 represents an alternative embodiment of the structure 200 in a situation where the mask opening 120 (illustrated in FIG. 17) overlaps a portion of the ILD 104. More specifically, the overlap of the mask opening 120 may form a portion of the ILD 104 along a sidewall of the second preformed barrier layer 214b (or the second liner 108 if the second preformed barrier layer 214b is not present). The present alternative embodiment may allow for more layers between the trench 122 and the second metal line 102b, which may result in additional insulation or may prevent possible diffusion with any subsequently deposited material. FIG. 20 depicts a section view of the structure 200 illustrated in FIG. 18 taken along section H according to an embodiment.

Figure 21:
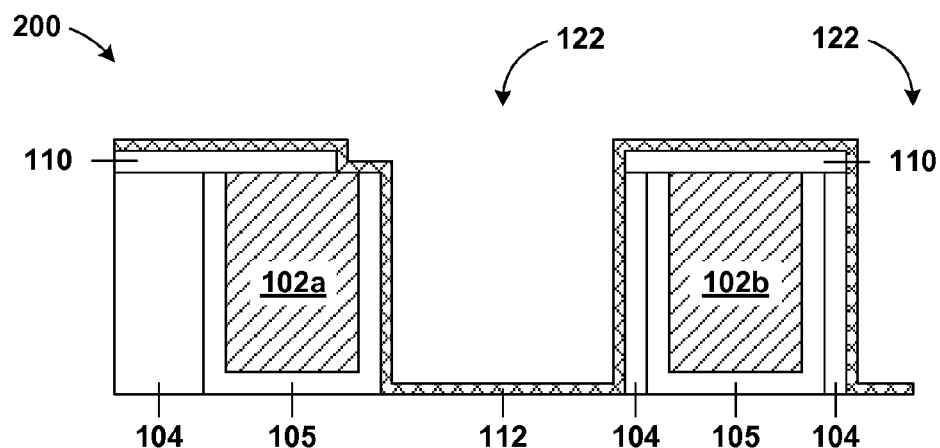
FIG. 21 is a cross section view of the semiconductor structure and illustrates the formation of an active component on the structure according to another embodiment.

FIG. 21 is a demonstrative illustration of the structure 200 during an intermediate step of a method of fabricating an air gap according to an embodiment. More specifically, the method may include the deposition of an active component 112 on the structure 200. The structure 200 illustrated in FIG. 21 may be similar to the structure 100 described in FIG. 9.

Figure 22:
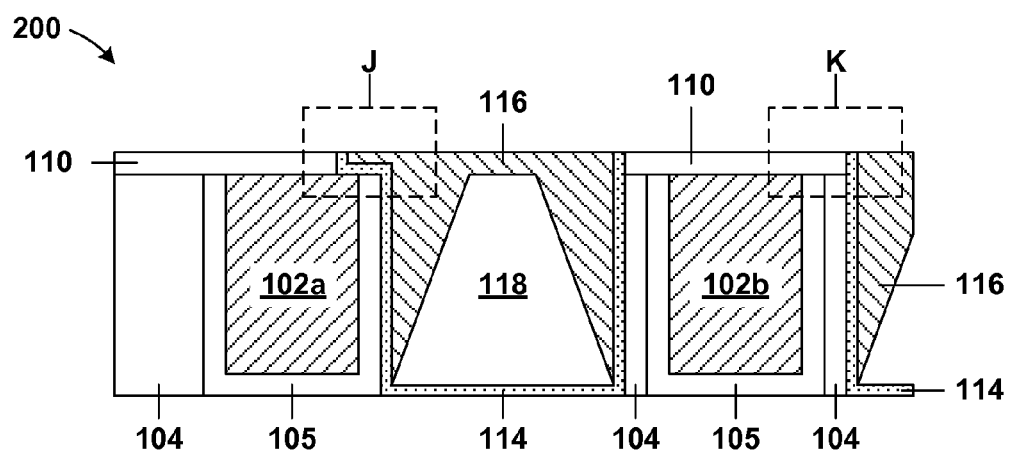
FIG. 22 is a cross section view of the semiconductor structure and illustrates the formation of an air gap, air gap oxide, and a barrier layer according to another embodiment.

FIG. 22 is a demonstrative illustration of the structure 200 during an intermediate step of a method of fabricating an air gap according to an embodiment. More specifically, the method may include the formation of an air gap oxide 116, an air gap 118, and a barrier layer 114. The structure 200 illustrated in FIG. 22 may be similar to the structure 100 described in FIG. 10.

Figure 23:
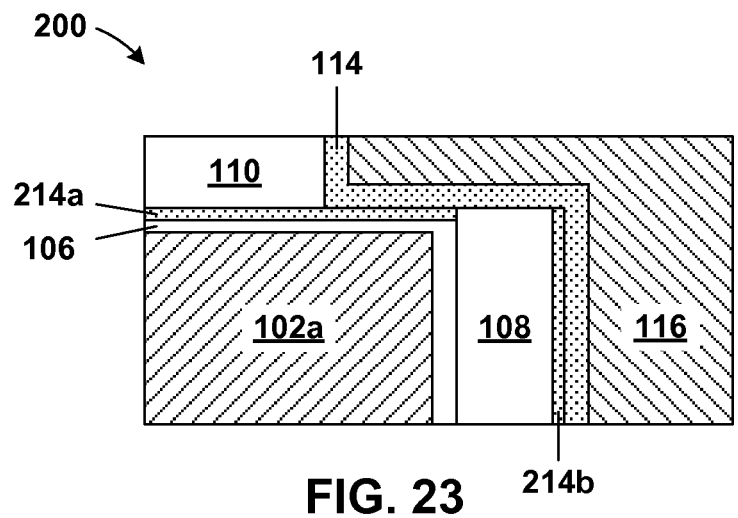
FIG. 23 is a section view of the structure illustrated in FIG. 22 taken along section view J and illustrates the formation of the barrier layer and the preformed barrier layer between the metal line and the air gap oxide according to another embodiment.
Figure 24:
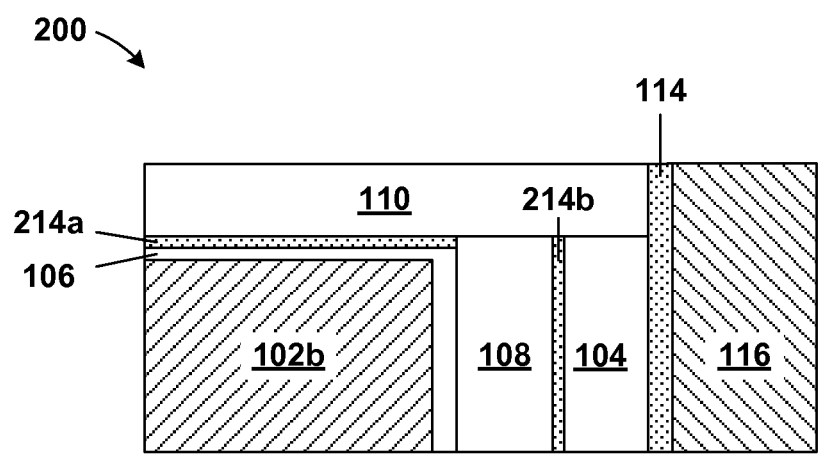
FIG. 24 is a section view of the structure illustrated in FIG. 22 taken along section view K and illustrates the formation of the barrier layer, the preformed barrier layer, and a dielectric layer between the metal line and the air gap oxide according to another embodiment.

FIGS. 23 and 24 represent alternative embodiments of the structure 200 in situations during the deposition of the air gap oxide 116. More specifically, each embodiment may represent the resulting barrier layer 114 from the previous embodiments illustrated in FIGS. 19 and 20, respectively. FIGS. 23 and 24 each depict a section view of the structure 200 illustrated in FIG. 22 taken along section J and K, respectively, according to an embodiment. The barrier layer 114 may form, for example, as a reaction of the active component 112 with the air gap oxide 116. Another possible embodiment may include the formation of the barrier layer 114 during a thermal annealing process. The resulting structures illustrated in FIGS. 23 and 24 may be representative of a final structure of the structure 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a first metal line and a second metal line in a dielectric layer, wherein the first metal line and the second metal line are adjacent and within the same dielectric level;
    an air gap structure in the dielectric layer and between the first metal line and the second metal line, wherein the air gap structure includes an air gap oxide layer and an air gap; and
    a single oxidized metal layer separating the air gap structure from both the first metal line and the second metal line, wherein the single oxidized metal layer is in direct contact with a top surface and an entire sidewall of the first metal line and remains directly separated from a top surface of the second metal line by a hardmask layer in direct contact with and completely covering the second metal line.

2. The semiconductor structure of claim 1, wherein the air gap oxide layer is a silicon oxide, and the single oxidized metal layer is aluminum oxide.

3. The semiconductor structure of claim 1, wherein a portion of the air gap oxide layer extends along a vertical sidewall of the single oxidized metal layer separating the air gap from the first metal line.

4. The semiconductor structure of claim 1, wherein the air gap is below an upper surface of the hardmask layer directly above each of the first metal line and the second metal line.

5. The semiconductor structure of claim 1, further comprising:
   a metal barrier layer lining each of the first metal line and the second metal line and separating them from the dielectric layer, wherein a portion of the single oxidized metal layer is in direct contact with the metal barrier layer of the first metal line, and another portion of the single oxidized metal layer is in direct contact with a portion of the dielectric layer remaining between the air gap structure and the second metal line.

6. The semiconductor structure of claim 5, wherein the single oxidized metal layer is in direct contact with a portion of the metal barrier layer located along the top surface of the first metal line.

\* \* \* \* \*